United States Patent
Harding

(10) Patent No.: US 6,956,877 B2
(45) Date of Patent: Oct. 18, 2005

(54) MEANS OF SUPPRESSION OF NON-BRAGG SIDE MODES

(75) Inventor: Ryan Kingsley Harding, Bexhill on Sea (GB)

(73) Assignee: Agilent Technologies, Inc., Palo Alto, CA (US)

( * ) Notice: Subject to any disclaimer, the term of this patent is extended or adjusted under 35 U.S.C. 154(b) by 234 days.

(21) Appl. No.: 10/372,689

(22) Filed: Feb. 24, 2003

(65) Prior Publication Data

US 2003/0161359 A1 Aug. 28, 2003

(30) Foreign Application Priority Data

Feb. 25, 2002 (EP) .............................................. 02251284

(51) Int. Cl.[7] .......................... H01S 3/098; H01S 3/08
(52) U.S. Cl. ........................ 372/19; 372/108; 372/102
(58) Field of Search .............................. 372/18, 19, 43, 372/64, 96, 101, 102, 108; 385/37

(56) References Cited

U.S. PATENT DOCUMENTS

| | | | |
|---|---|---|---|
| 4,358,851 A | 11/1982 | Scifres et al. ................. 372/97 |
| 4,573,156 A | 2/1986 | Anthony et al. ............... 372/19 |
| 4,583,226 A | 4/1986 | Liou ............................. 372/19 |
| 4,716,132 A | * 12/1987 | Hirata .......................... 438/32 |
| 4,777,148 A | * 10/1988 | Liau et al. .................... 438/32 |
| 4,823,357 A | 4/1989 | Casey .......................... 372/92 |
| 5,432,610 A | * 7/1995 | King et al. .................. 356/432 |
| 5,477,555 A | * 12/1995 | Debeau et al. ............... 372/25 |
| 5,608,743 A | * 3/1997 | Hayakawa .................... 372/20 |
| 5,808,788 A | 9/1998 | Park et al. .................. 356/341 |
| 6,618,407 B1 | * 9/2003 | Andrews et al. ......... 372/38.02 |
| 6,628,407 B2 | * 9/2003 | Atia et al. .................. 356/519 |

OTHER PUBLICATIONS

Herve, D. European Search Report Application No. EP 02 25 1284 dated Jan. 10, 2003.

* cited by examiner

Primary Examiner—Minsun Oh Harvey
Assistant Examiner—Armando Rodriguez

(57) ABSTRACT

A single longitudinal mode laser, such as a distributed feedback laser, that comprises a filter. The filter selectively attenuates wavelengths that are lower than the wavelength of the laser's dominant mode, such that when operating at extremes of temperature, the power of the gain peak does not become too great relative to the dominant mode of the laser.

12 Claims, 3 Drawing Sheets

Second peak at 1293 nm, -39.5 dB.    Main peak at 1309 nm, 0.0 dB.

Second peak at 1288 nm, -29.2 dB.    Main peak at 1310 nm, 0.0 dB.

MEANS OF SUPPRESSION OF NON-BRAGG SIDE MODES

FIELD OF THE INVENTION

This invention relates to the field of semiconductor lasers and in particular single longitudinal mode lasers.

DISCUSSION OF THE BACKGROUND

A class of lasers commonly used in optical communications systems is single longitudinal mode (SLM) lasers. These lasers tend to be semiconductor diode lasers and have a dominant transmission mode such that the vast majority of the radiation is transmitted at the wavelength of the dominant transmission mode. Typically, the dominant transmission mode emits at a power that is 30–40 dB greater than the next most powerful mode. The most common form of SLM laser is the Distributed Feedback (DFB) laser, in which a refractive-index grating is formed within the semiconductor device to enhance the Bragg reflection of a particular optical wavelength within the laser cavity. This causes the wavelength reflected by the grating to experience significantly greater gain than other potential longitudinal modes, causing the wavelength reflected by the grating to define the dominant transmission mode of the laser.

Other types of SLM laser are the Distributed Bragg Reflector (DBR) laser and the Vertical Cavity Surface Emitting Laser (VCSEL). DBR lasers incorporate an external Bragg grating that reflects radiation of a particular wavelength back into the laser cavity, this reflected wavelength defining the dominant transmission mode of the laser. VCSELs also use a Bragg grating to reflect light back into the cavity, but due to the VCSEL structure the grating is formed outside the gain region but is integrated within the same epitaxially grown structure.

SLM lasers are commonly used in optical communications systems conforming to the SDH (Synchronous Digital Hierarchy) and SONET (Synchronous Optical Network) standards. One requirement of the physical layer standards is that the transmitter must exhibit a Side Mode Suppression Ratio (SMSR) of at least 30 dB, which means that the power of the single dominant transmission mode must be at least 30 dB greater than that of each of the other transmitted modes.

An observed problem with some SLM lasers is that at low temperatures the gain peak, which is defined by the semiconductor band gap, shifts to a lower wavelength than that of the device grating. This can lead to some modes near to the gain peak having a power that breaches the minimum SMSR requirement. It is an object of the present invention to provide a semiconductor laser arrangement that addresses this problem.

A similar problem that may be seen in SLM lasers occurs at high temperatures, where the gain peak is at a longer wavelength than the grating wavelength, leading to a breach of the SMSR requirement in a similar way. If the suppression of the modes near the gain peak is not sufficient, one or more modes near the gain peak may have a power that breaches the minimum SMSR requirement. The present invention additionally provides a means of addressing this problem alone or in conjunction with the low-temperature problem outlined above.

SUMMARY OF THE INVENTION

According to a first aspect of the invention there is provided a semiconductor laser arrangement comprising a single longitudinal mode laser device having a grating arranged to provide feedback to an active region of the laser device, thereby facilitating substantially single mode emission at a dominant wavelength, the laser device further emitting a plurality of non-dominant wavelengths, the arrangement further comprising an optical filter arranged to transmit the dominant wavelength and to attenuate the non-dominant wavelengths.

In a further embodiment the optical filter is arranged to substantially prevent reflections from the filter re-entering the active region of the laser device.

In an alternative embodiment the optical filter attenuates one or more non-dominant wavelengths, the non-dominant wavelengths having a lower wavelength than the dominant wavelength. In a further alternative the optical filter attenuates one or more non-dominant wavelengths, the non-dominant wavelengths having a higher wavelength than the dominant wavelength.

The optical filter may be an interference filter and may additionally comprise multiple dielectric layers. The semiconductor laser arrangement may further comprise alignment means comprising an optical filter. The alignment means may comprise a lens, the lens comprising an optical filter. Furthermore the lens may comprise a ball lens.

The semiconductor laser arrangement may further comprise an optical isolator, the optical isolator comprising an optical filter or the semiconductor laser arrangement may further comprise a termination means, the termination means receiving an optical fibre. An optical filter may be formed on the end face of the optical fibre. The semiconductor laser arrangement may comprise one or more optical filters. The semiconductor laser device may be a distributed feedback laser.

According to a second aspect of the invention there is provided a transmission network comprising a semiconductor laser module as described above.

BRIEF DESCRIPTION OF THE DRAWINGS

The invention will now be described, by way of example only, with reference to the following Figures in which.

DETAILED DESCRIPTION OF THE PREFERRED EMBODIMENT

Multi-longitudinal mode (MLM) lasers, such as Fabry-Perot lasers, operate at wavelengths that are close to the gain peak (and the spontaneous emission peak) and the wavelength of the gain peak increases with increasing temperature. DFB lasers have the same fundamental gain peak, but the Fabry-Perot modes are suppressed by the addition of the grating and the adoption of one or more low-reflectance facets, causing the laser to operate at the wavelength defined by the grating structure. This operating wavelength will also change with temperature, but at a lower rate than the change of the fundamental gain peak. For example, in indium phosphide the underlying gain peak wavelength may increase by approximately 0.35–0.4 nm/K, whilst the operating wavelength may increase by approximately 0.08 nm/K. When designing a DFB laser it is usually important for operation at higher temperatures that the operating wavelength does not deviate excessively from the gain peak wavelength for the increased temperatures at which the laser is to operate.

Figure 5:
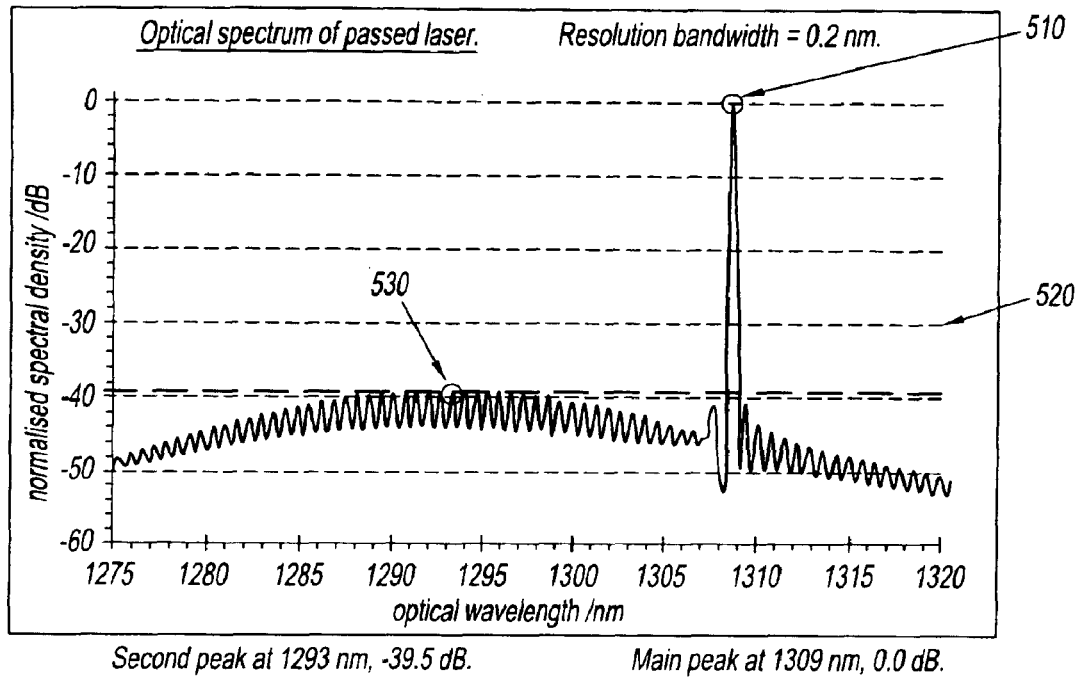
FIG. 5 shows a graphical depiction of the optical spectrum of a prior art laser device that exhibits sufficient SMSR at low temperature.
Figure 6:
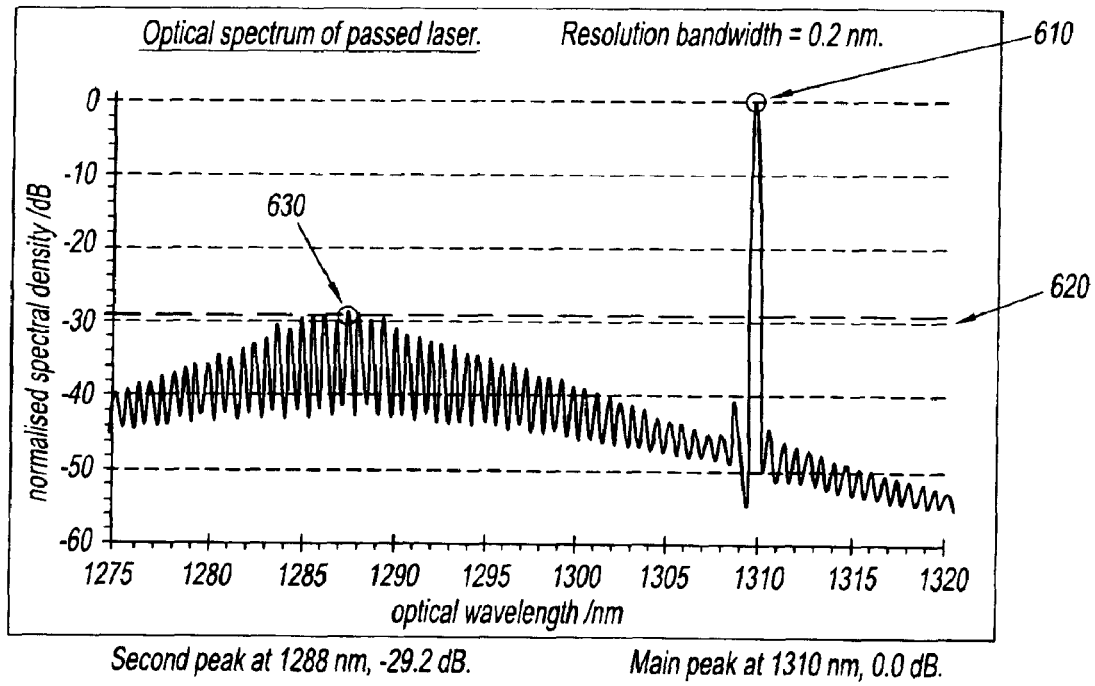
FIG. 6 shows a graphical depiction of the optical spectrum of a similar prior art laser device that exhibits insufficient SMSR at low temperature.

FIG. 5 shows the optical spectrum of a DFB laser at low temperature. The dominant transmission mode is clearly shown at a wavelength of approximately 1309 nm, with the gain peak having its maximum value at approximately 1293 nm. The power level of the dominant mode (indicated by numeral 510) is much greater than that of the gain peak (reference 530). The SMSR 30 dB limit is also shown (reference 520) and it is clear that in this case the laser exceeds the SMSR requirement by a significant margin. FIG. 6 shows the gain characteristic of a similar DFB laser at the same temperature. The dominant mode is similar, but the gain peak wavelength of this device is below 1290 nm and the amplitude of the gain peak is significantly greater for this device. In this case, the difference between the power level of the dominant mode 610 and the gain peak 630 is just less than 30 dB and thus the SMSR requirement (reference 620) is no longer met.

Figure 1:
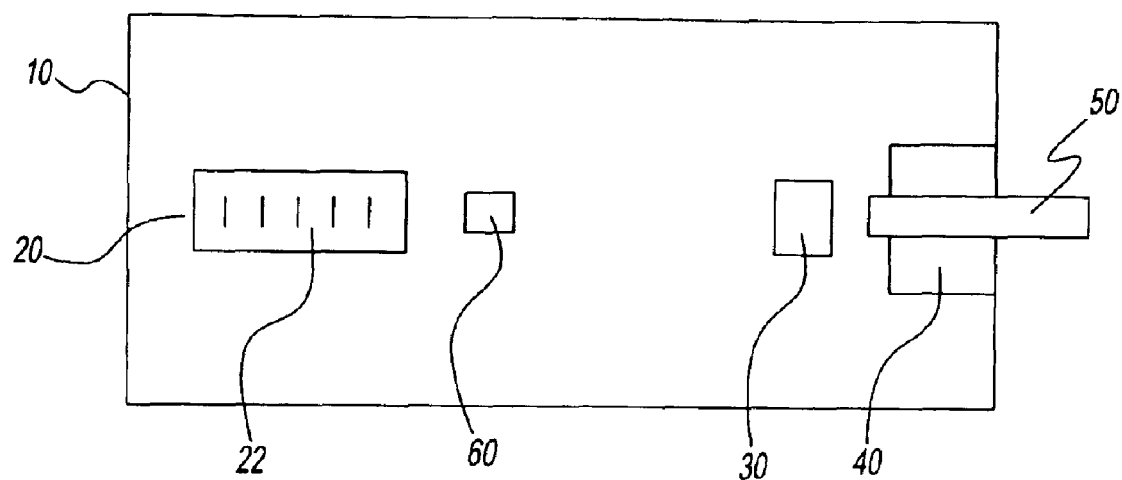
FIG. 1 shows a schematic depiction of a semiconductor laser module according to the present invention.

FIG. 1 shows a schematic view of a semiconductor laser module according to the present invention that is suitable for use as a transmitter in an optical transmission network. The semiconductor laser module 10 comprises semiconductor laser device 20, alignment means 30 and termination means 40. The termination means 40 receives and holds an end of an optical fibre 50. The semiconductor laser device 20 is positioned such that the light launched from the laser 20 falls upon the alignment means 30. The alignment means 30 is such that the light launched by the laser is focused onto the core of an optical fibre 50 held within the termination means 40. The semiconductor laser module 10 additionally comprises an optical filter 60 that, in one embodiment of the present invention, is located between the laser 20 and the alignment means 30.

The optical filter 60 is designed to attenuate wavelengths around the gain peak wavelength without interfering with the grating wavelength that is transmitted by the laser. For example, if the grating wavelength is close to 1310 nm and the low temperature gain peak wavelength is around 1280 nm to 1290 nm then a suitable wavelength response for the optical filter would pass optical wavelengths of greater than roughly 1305 nm with substantially no attenuation, while moderately attenuating optical wavelengths of 1295 nm and below. The amount of attenuation applied by the filter will depend upon the variation of SMSR as the temperature is decreased, but it is thought that an attenuation of 5–10 dB will be suitable in most cases. In addition to addressing the problems that some DFB lasers experience under extremes of low temperature, the addition of an optical filter can also be used to improve the yield of a fabrication process. Devices that have a marginal SMSR can have their performance improved such that the SMSR requirement is met comfortably.

If the requirement is to solve a high-temperature problem of this type, the grating wavelength might be around 1320 nm while the gain peak wavelength is around 1340 to 1350 nm. A suitable wavelength response to solve the high-temperature problem alone might be to pass all wavelengths below roughly 1325 nm with substantially no attenuation, while moderately attenuating wavelengths of 1335 nm and above.

Alternatively, a suitable wavelength response that solves both the low-temperature and high-temperature problems might pass wavelengths from roughly 1305 to 1325 nm with substantially no attenuation, while moderately attenuating wavelengths below roughly 1295 nm and wavelengths above roughly 1335 nm.

FIG. 1 shows that the optical filter 60 is located between the laser device 20 and the alignment means 30. However, it will be understood that the filter could be located elsewhere in the laser module, or integrated with another component, and that there are many different ways in which the optical filter can be implemented. For example, the filter could be designed into the fabrication of the semiconductor laser device itself, although this option is not preferred as it will entail an increase in the cost and complexity of the device fabrication process. However, if a specialist application requires devices that are capable of operating at very low temperatures then it may be cost effective to fabricate the filters in this manner.

If light from the filter is reflected back into the laser cavity, it may affect the laser's output spectrum and noise characteristics. The possible effects of reflections from a filter can be reduced by angling the filter so that reflections back into the laser cavity are sufficiently reduced. It is also possible to position the filter beyond the isolator (if fitted) to prevent the reflected light from re-entering the laser cavity.

If, for example, an interference filter were to be made from multiple-layers of dielectric material then this could be formed on a glass flat, which could be placed within the laser's light path. Alternatively, such a filter could be formed on one of the other components in the laser module.

Figure 2:
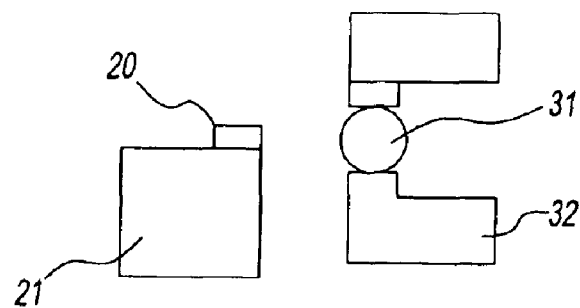
FIG. 2 shows a schematic depiction of a first embodiment of a semiconductor laser module according to the present invention.

FIG. 2 shows a schematic depiction of such an alternative arrangement in which semiconductor laser device 20 is mounted on a support block 21. The output of the semiconductor laser device 20 passes through a ball lens 31 that focuses the light from the semiconductor laser device into the core of an optical fibre (not shown). The ball lens is supported within a frame 32 that comprises a part of the alignment means 30 described above in reference to FIG. 1. An optical filter may be implemented by coating the ball lens with a coating that either absorbs, reflects or scatters light from the gain peak without significantly affecting the dominant transmission mode. The difference in incidence angle between meridional and nonmeridional rays for a ball lens makes the design of an interference filter more difficult than with other options.

Figure 3:
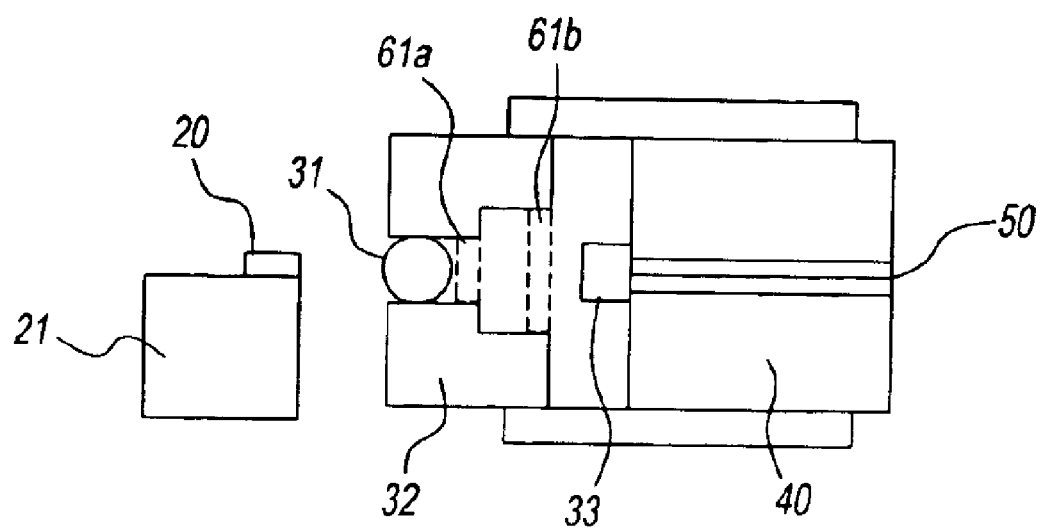
FIG. 3 shows a schematic depiction of a second embodiment of a semiconductor laser module according to the present invention.
Figure 4:
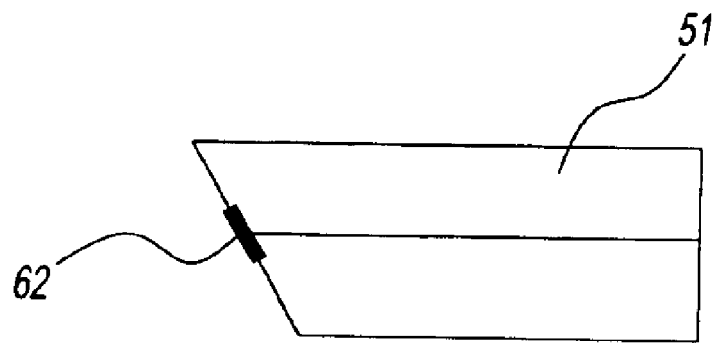
FIG. 4 shows a schematic depiction of a third embodiment of a semiconductor laser module according to the present invention.

FIG. 3 shows a schematic depiction of further embodiments of the present invention. The embodiment shown in FIG. 2 is interconnected with termination means 40 that is holding optical fibre pigtail 50. An optical isolator 33 has been attached to the end of the optical fibre to prevent back-reflections from components outside the laser module from entering the laser module. Filters may be placed at locations 61*a* and/or 61*b* within the alignment means (or potentially elsewhere, within the optical path). Additionally, the isolator may be modified to include the functionality of a suitable filter, for example, by application of a surface coating. FIG. 4 shows a further option for the location of a filter 62, which has been applied to the end-face of an optical fibre 51. FIG. 4 shows the optical fibre having an angled end-face, which is typically done to reduce the reflections from the end-face back into the laser device or back into the fibre's guided mode.

The example given above is purely illustrative and it will be readily apparent to those skilled in the art that it may be used with lasers having a dominant transmission mode of any wavelength. The point at which filtering needs to be applied, and the amount of filtering to be applied, will vary from device to device and some measurement and experimentation may be required to find an adequate solution. Because of the possibility of small power fluctuations at the grating wavelength, which are caused by mode competition, it may be advisable to measure the Relative Intensity Noise (RIN) in the output of the laser module to ensure that there is not a significant receiver sensitivity penalty. It will be understood that the invention could also be implemented by concatenating a number of filters within a single laser module. This may be of advantage as it enables filter characteristics to be built up from the combination of concatenated filters, which may provide a simpler and more cost effective method to assemble the filter, especially if a complex filter characteristic is required. Whilst the preceding discussion has centred upon the use of DFB lasers, it is believed that the present invention is also suitable for use with other single longitudinal mode lasers.

It would also be possible to produce an in-line filter for inclusion within the optical fibre plant outside the laser module, to achieve the same effect. For example, a pigtailed filter that may be spliced into the fibre network is possible, or a filter supplied with connector termination is possible. The filter in such cases may be of the type described above, or it may optionally comprise an in-fibre grating with suitable wavelength response or a means of attenuating or removing guided waves at the appropriate gain-peak wavelength by manipulation of the optical waveguide structure.

What is claimed is:

1. A semiconductor laser arrangement comprising:
   a single longitudinal mode laser device having a grating arranged to provide feedback to an active region of the laser device, thereby facilitating substantially single mode emission at a dominant wavelength, the laser device further emitting a plurality of non-dominant wavelengths; and
   an optical filter arranged to transmit the dominant wavelength and to attenuate the non-dominant wavelengths,
   wherein the semiconductor laser arrangement further comprises a terminator, wherein the terminator receives an optical fibre, and
   wherein the optical filter is formed on an end face of the optical fibre.

2. A semiconductor laser arrangement according to claim 1, wherein the optical filter is arranged to substantially prevent reflections from the optical filter re-entering the active region of the laser device.

3. A semiconductor laser arrangement according to claim 2, in which the optical filter attenuates one or more non-dominant wavelengths, the non-dominant wavelengths having a lower wavelength than the dominant wavelength.

4. A semiconductor laser arrangement according to claim 2, in which the optical filter attenuates one or more non-dominant wavelengths, the non-dominant wavelengths having a higher wavelength than the dominant wavelength.

5. A semiconductor laser arrangement according to claim 1, wherein the optical filter is an interference filter.

6. A semiconductor laser arrangement according to claim 5, wherein the optical filter comprises multiple dielectric layers.

7. A semiconductor laser arrangement according to claim 1, wherein the semiconductor laser arrangement further comprises an alignment means, wherein the alignment means comprises the optical filter.

8. A semiconductor laser arrangement according to claim 7, wherein the alignment means comprises a lens, the lens comprising the optical filter.

9. A semiconductor laser arrangement according to claim 8, wherein the lens is a ball lens.

10. A semiconductor laser arrangement according to claim 1, wherein the semiconductor laser arrangement further comprises an optical isolator, wherein the optical isolator comprises the optical filter.

11. A semiconductor laser arrangement according to claim 1, wherein the single longitudinal mode laser device is a distributed feedback laser.

12. A transmission network comprising a semiconductor laser arrangement comprising:
   a single longitudinal mode laser device having a grating arranged to provide feedback to an active region of the laser device, thereby facilitating substantially single mode emission at a dominant wavelength, the laser device further emitting a plurality of non-dominant wavelengths; and
   an optical filter arranged to transmit the dominant wavelength and to attenuate the non-dominant wavelengths,
   wherein the semiconductor laser arrangement further comprises a terminator, wherein the terminator receives an optical fibre, and
   wherein the optical filter is formed on the end face of the optical fibre.

* * * * *